(12) United States Patent
Selverian et al.

(10) Patent No.: US 7,897,234 B2
(45) Date of Patent: Mar. 1, 2011

(54) POTTING MATERIAL FOR ELECTRONIC COMPONENTS

(75) Inventors: John H. Selverian, Stoneham, MA (US); H. Steven Mackel, Pepperell, MA (US); William D. Koenigsberg, Concord, MA (US)

(73) Assignee: OSRAM SYLVANIA Inc., Danvers, MA (US)

(*) Notice: Subject to any disclaimer, the term of this patent is extended or adjusted under 35 U.S.C. 154(b) by 1146 days.

(21) Appl. No.: 10/342,854

(22) Filed: Jan. 15, 2003

(65) Prior Publication Data

US 2004/0137173 A1 Jul. 15, 2004

(51) Int. Cl.
*B32B 3/02* (2006.01)
*B32B 1/04* (2006.01)

(52) U.S. Cl. .................. 428/76; 174/522; 174/521; 336/96; 257/788; 257/794; 257/787; 257/789; 29/841

(58) Field of Classification Search ............... 174/52.2, 174/52.1, 521, 522; 336/96; 257/788, 794, 257/787, 789; 29/841; 428/34.1, 35.7, 76
See application file for complete search history.

(56) References Cited

U.S. PATENT DOCUMENTS

| | | | | |
|---|---|---|---|---|
| 2,083,007 A | * | 6/1937 | Delaney | 106/270 |
| 4,022,635 A | * | 5/1977 | Earing | 106/280 |
| 4,916,363 A | | 4/1990 | Burton et al. | 315/276 |
| 5,386,086 A | | 1/1995 | Sayles | 174/52.2 |
| 5,726,386 A | | 3/1998 | Calhoun | 174/52.2 |
| 6,027,557 A | * | 2/2000 | Hayner | 106/279 |

* cited by examiner

*Primary Examiner*—Michael C Miggins
(74) *Attorney, Agent, or Firm*—Carlos S. Bessone; Shaun P. Montana

(57) ABSTRACT

A potting compound for electronic components comprises a first composition of asphalt and sand and a second composition that attenuates the forces normally applied by the first composition when it is used alone. The force attenuator preferably comprises solvent-refined heavy paraffinic petroleum oil from about 0.1 to 20 wt % of the compound.

4 Claims, 4 Drawing Sheets

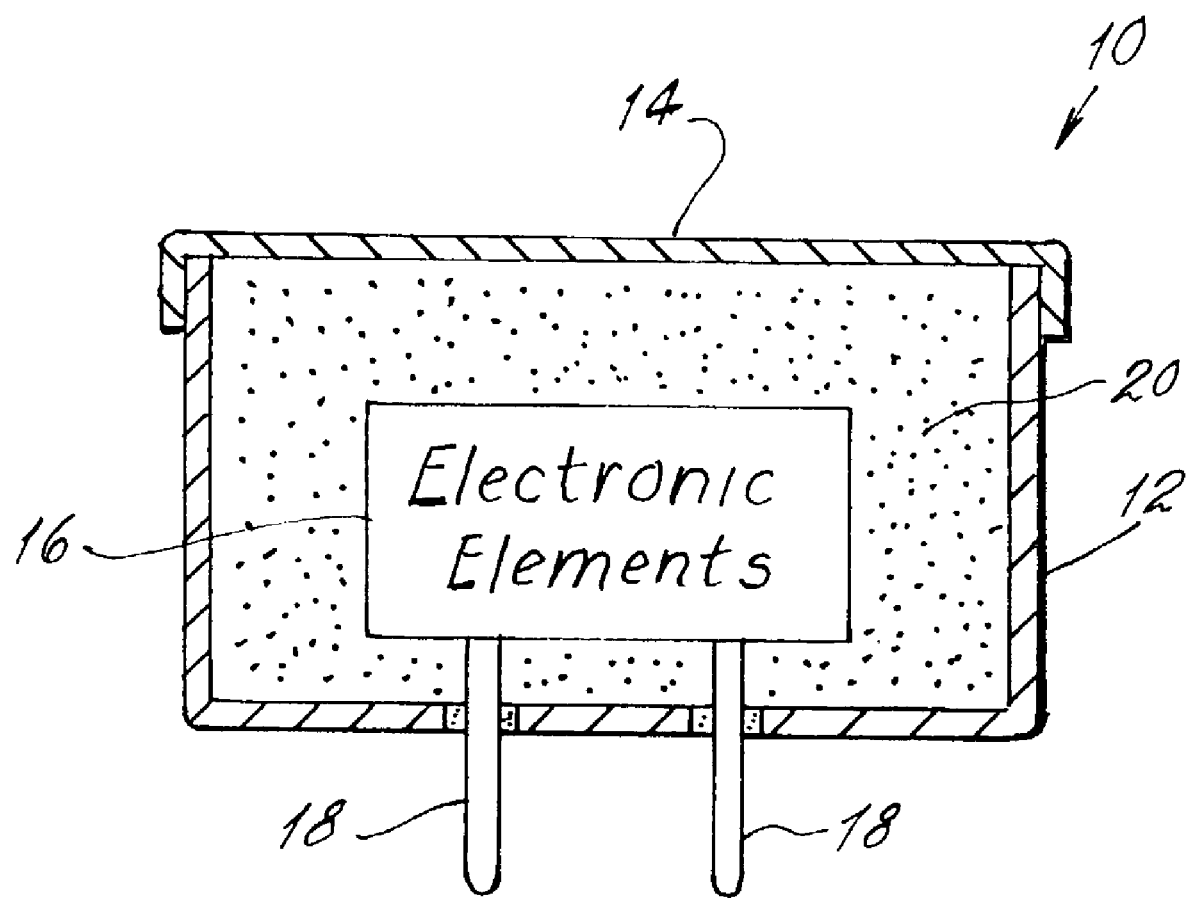

POTTING MATERIAL FOR ELECTRONIC COMPONENTS

TECHNICAL FIELD

This invention relates to potting compounds and more particularly to potting compounds containing a force attenuator. Still more particularly it relates to potting compounds for electronic elements such as ballasts for arc discharge lamps and, in particular, fluorescent lamps.

BACKGROUND ART

It is known to apply potting materials to electrical circuits; that is, to encase electrical elements within a container or housing with an enviromnent-impervious material in order to protect the elements, to enhance heat dissipation or to add safety features.

These materials have included epoxy resins and mixtures of asphalt and sand. This invention is concerned principally with the latter.

The asphalt/sand mixture is employed frequently for electronic ballasts for fluorescent lamps because of its low cost and good heat transfer properties. A major problem with this type of potting material is that, because it encapsulates the electrical elements, large forces can be applied to the elements during the typical heating and cooling cycles encountered during use. These large forces have been known to cause failure of the system by causing failure of the solder joints used, for example, in connecting elements to a circuit board.

DISCLOSURE OF INVENTION

It is, therefore, an object of the invention to obviate the disadvantages of the prior art.

It is another object of the invention to enhance potting materials.

It is yet another object of the invention to attenuate the forces applied to elements contained within a potting material.

These objects are achieved, in one aspect of the invention, by the provision of a potting compound that comprises a first composition which, when used alone, applies a given force to elements encased within it and a second composition which attenuates that force. Incorporation of the second composition results in a significant reduction in broken solder joints as a failure mode and greatly increases the life of the system with which it is employed.

BRIEF DESCRIPTION OF THE DRAWINGS

FIG. 4 is a diagrammatic sectional view of an electronic unit that can use the invention.

BEST MODE FOR CARRYING OUT THE INVENTION

For a better understanding of the present invention, together with other and further objects, advantages and capabilities thereof, reference is made to the following disclosure and appended claims in conjunction with the above-described drawings.

Figure 1:
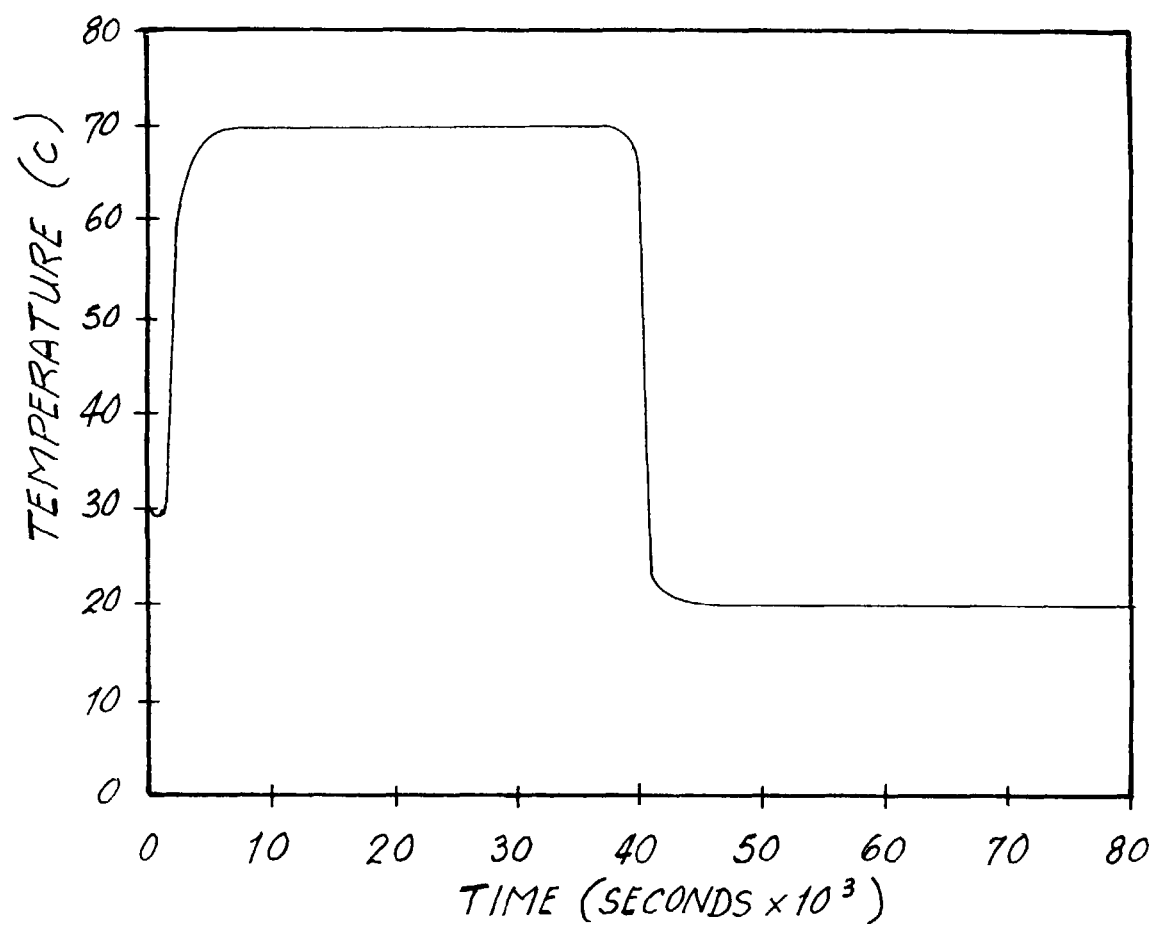
FIG. 1 is a graph of a standard temperature cycle used with potted elements.

Referring now to the drawings with greater particularity, there is shown in FIG. 1 a graph of a temperature cycle used for testing potted electronic elements. This standard temperature cycle involves heating to 70° C. for 12 hours, followed by 10 hours at 20° C.

Figure 2:
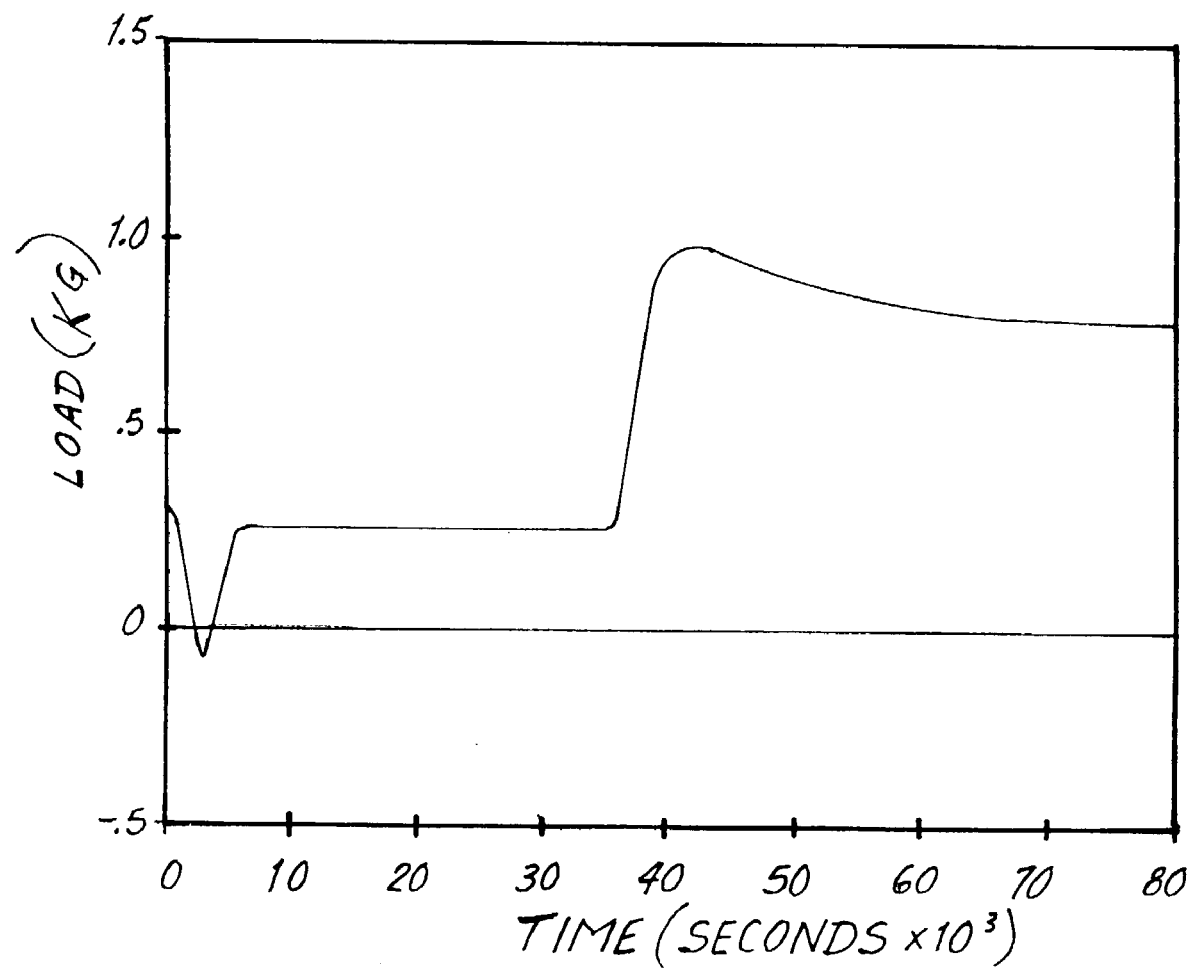
FIG. 2 is graph of the forces applied to potted elements by a prior art compound.

FIG. 2 is a plot of the forces applied during this temperature cycle by a prior art potting compound comprised of an asphalt and sand mixture. As will be seen from the plot the peak force applied by this prior art compound is approximately 1 Kg.

Figure 3:
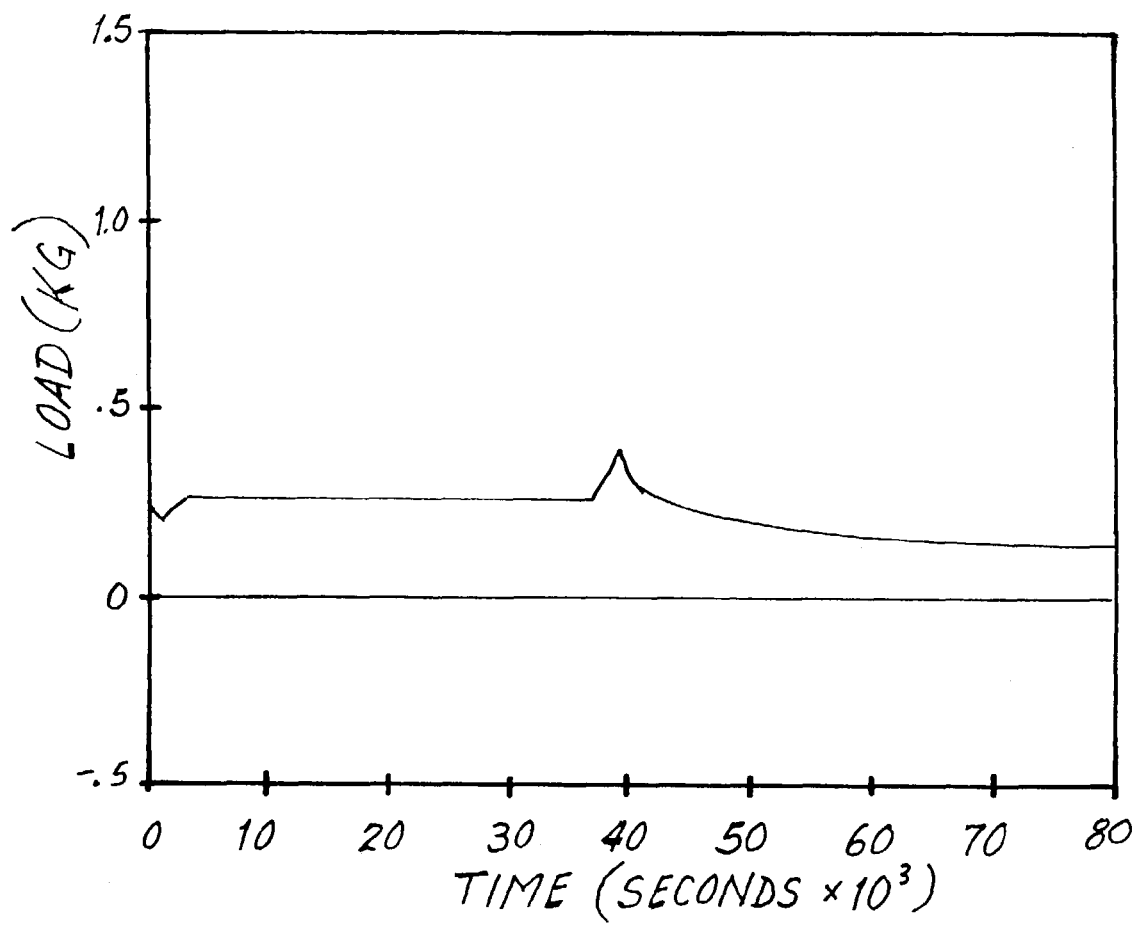
FIG. 3 is a graph of the forces applied to potted elements by the compound of the invention.

FIG. 3 illustrates the difference when a potting compound with a force attenuator added is used. With the force attenuator the maximum force applied to the components is approximately 0.4 Kg during the above-described standard heating cycle. The more than 60% reduction in the force applied is a significant difference that greatly increases the life of the potted elements.

In a preferred embodiment of the invention the force attenuator comprises from about 0.1 to about 20 wt % of a solvent-refined heavy paraffinic petroleum oil. One suitable compound is Hydrolene® SP125 manufactured by Sunoco Inc. of Philadelphia, Pa. The plot of FIG. 3 is actually a compound that includes 7.5 wt % of Hydrolene SP125.

FIG. 4 depicts diagrammatically an electronic unit 10 employing the invention. Unit 10 comprises a housing 12 with a cover 14 and includes electronic elements 16 having at least one electrical connection 18 exiting the housing. Electronic elements 16 can form, for example, an electronic ballast for a fluorescent lamp. Potting compound 20 comprises a first composition such as a mixture of asphalt and sand and a second composition comprising a force attenuator, for example, 7.5 wt % of Hydrolene SP125.

The reduction in force achieved by the addition of the force attenuator will lead to fewer ballast failures caused by solder joint fracture.

While there have been shown and described what are at present considered to be the preferred embodiments of the invention, it will be apparent to those skilled in the art that various changes and modifications can be made herein without departing from the scope of the invention as defined by the appended claims.

What is claimed is:

1. A potting compound comprising:
   a first composition which when used alone applies a given force to elements encased within it; and
   a second composition which attenuates said force when subjected to thermal cycling, wherein said second composition comprises a solvent-refined paraffinic petroleum oil.

2. The potting compound of claim 1 wherein said paraffinic petroleum oil comprises about 0.1 to 20 wt % of said compound.

3. An electronic unit comprising:
   a housing; p1 at least two electronic elements contained within said housing; and
   a potting compound surrounding said electronic elements on at least three sides, said potting compound comprising a first composition which when used alone applies a given force to said electronic elements; and
   a second composition that attenuates said force when subjected to thermal cvcling, wherein said second composition comprises a solvent-refined paraffinic petroleum oil.

4. The electronic unit of claim 3 wherein said paraffinic petroleum oil comprises about 0.1 to 20 wt % of said compound.

* * * * *